(12) United States Patent
Takakuwa

(10) Patent No.: US 10,921,722 B2
(45) Date of Patent: Feb. 16, 2021

(54) EXPOSURE APPARATUS, EXPOSURE METHOD, AND SEMICONDUCTOR DEVICE MANUFACTURING METHOD

(71) Applicant: Toshiba Memory Corporation, Minato-ku (JP)

(72) Inventor: Manabu Takakuwa, Tsu (JP)

(73) Assignee: Toshiba Memory Corporation, Minato-ku (JP)

( * ) Notice: Subject to any disclaimer, the term of this patent is extended or adjusted under 35 U.S.C. 154(b) by 100 days.

(21) Appl. No.: 16/123,304

(22) Filed: Sep. 6, 2018

(65) Prior Publication Data

US 2019/0271922 A1 Sep. 5, 2019

(30) Foreign Application Priority Data

Mar. 2, 2018 (JP) .............................. JP2018-037866

(51) Int. Cl.
*G03F 9/00* (2006.01)
*G03F 7/20* (2006.01)

(52) U.S. Cl.
CPC ........ *G03F 9/7088* (2013.01); *G03F 7/70258* (2013.01); *G03F 7/70358* (2013.01);
(Continued)

(58) Field of Classification Search
CPC .................. G03F 9/70; G03F 9/7003; G03F 9/7023–9/7034; G03F 9/7073; G03F 9/7084; G03F 9/7088; G03F 9/7007–7015; G03F 7/70258; G03F 7/70266; G03F 7/70308; G03F 7/70483; G03F 7/70491; G03F 7/70516; G03F 7/70616; G03F 7/70633; G03F 7/70666; G03F 7/70683; G03F 7/70716; G03F 7/70725;
(Continued)

(56) References Cited

U.S. PATENT DOCUMENTS 5,695,897 A * 12/1997 Mitome .............. G03F 7/70458
430/22
6,278,957 B1 8/2001 Yasuda et al.
(Continued)

FOREIGN PATENT DOCUMENTS

JP 6-275496 9/1994
JP 7-183214 7/1995
(Continued)

*Primary Examiner* — Christina A Riddle
(74) *Attorney, Agent, or Firm* — Oblon, McClelland, Maier & Neustadt, L.L.P.

(57) ABSTRACT

According to one embodiment, there is provided an exposure apparatus which projects a pattern of an original onto a substrate by a projection optical system so as to expose the substrate. The exposure apparatus includes a substrate stage, an alignment detecting system, and a controller. The substrate stage holds the substrate on which shot areas each including multiple chip areas are placed. The alignment detecting system detects multiple first alignment marks placed in a peripheral region in a first chip area in the shot area. The controller obtains the first amount of positional deviation for the first chip area according to results of detecting the multiple first alignment marks and controls exposure conditions for the first chip area in the shot area according to the first amount of positional deviation.

13 Claims, 8 Drawing Sheets

(52) U.S. Cl.
CPC ...... *G03F 7/70616* (2013.01); *G03F 7/70775* (2013.01); *G03F 9/7007* (2013.01); *G03F 9/7084* (2013.01)

(58) Field of Classification Search
CPC ............... G03F 7/70775; G03F 7/7085; G03F 7/70991; G03F 7/70358; H01L 21/681; H01L 21/682
USPC ............... 355/52, 53, 55, 67–71, 72, 75, 77; 430/22, 30, 322; 356/399–401, 614–620, 356/622, 624, 500, 601, 609; 250/492.1, 250/49.2, 492.22, 492.23, 493.1, 503.1, 250/559.29, 559.3, 548
See application file for complete search history.

(56) References Cited

U.S. PATENT DOCUMENTS

| | | | |
|---|---|---|---|
| 2001/0019401 A1* | 9/2001 | Irie | G03F 9/7015 355/53 |
| 2001/0049589 A1* | 12/2001 | Yasuda | G03F 9/7003 702/150 |
| 2007/0064211 A1* | 3/2007 | Hatai | G03F 7/70633 355/55 |
| 2010/0208228 A1* | 8/2010 | Koga | G03F 9/7011 355/75 |
| 2010/0259741 A1* | 10/2010 | Koga | G03F 9/7011 355/67 |
| 2011/0216294 A1 | 9/2011 | Menchtchikov et al. | |
| 2012/0133914 A1* | 5/2012 | Prosyentsov | G03F 1/44 355/53 |
| 2012/0140193 A1* | 6/2012 | Chiu | G03F 9/7003 355/53 |
| 2017/0148656 A1* | 5/2017 | Takakuwa | G03F 7/70141 |

FOREIGN PATENT DOCUMENTS

| | | |
|---|---|---|
| JP | 2001-274073 | 10/2001 |
| JP | 2011-159718 | 8/2011 |
| JP | 2013-520019 | 5/2013 |

* cited by examiner

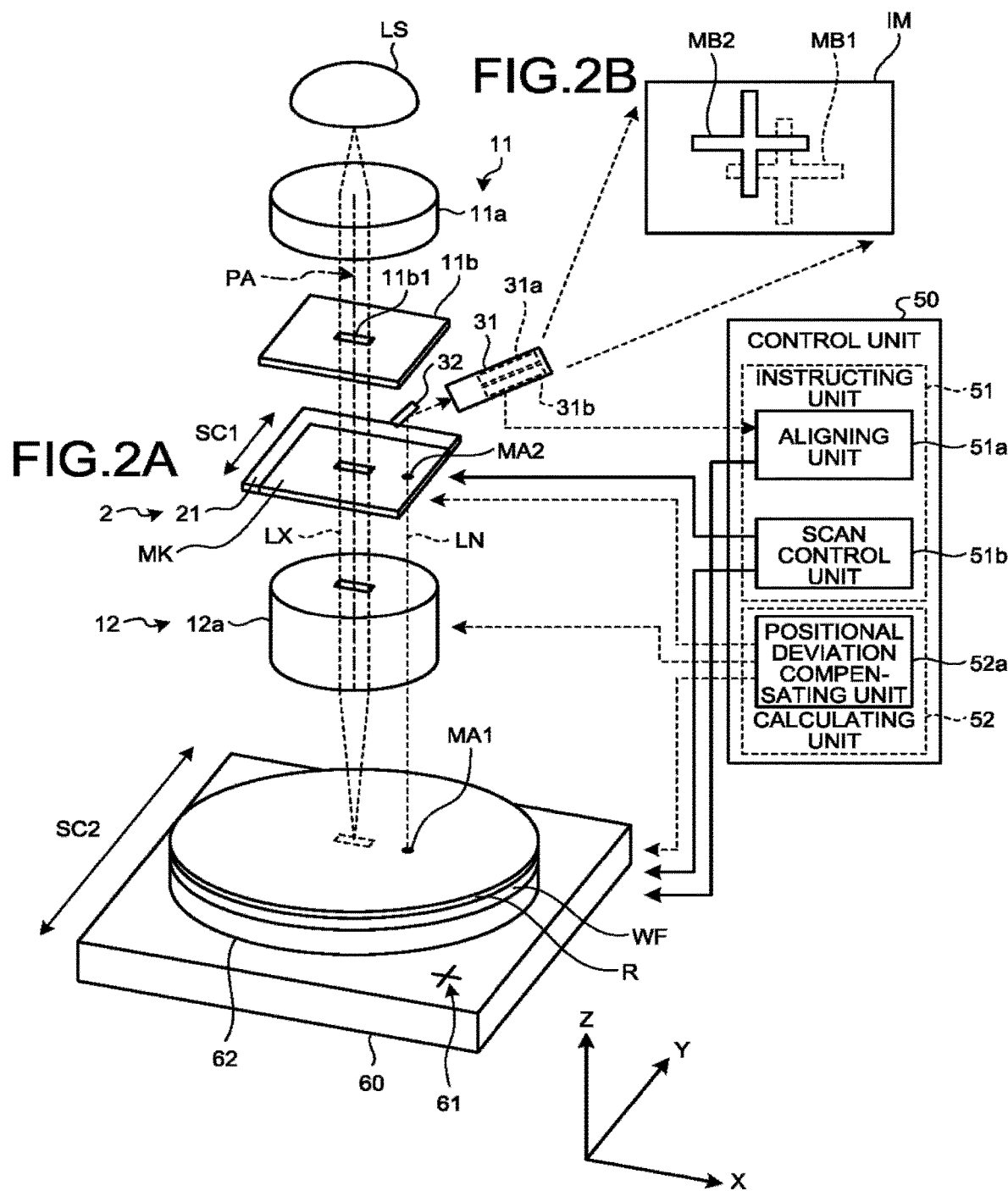

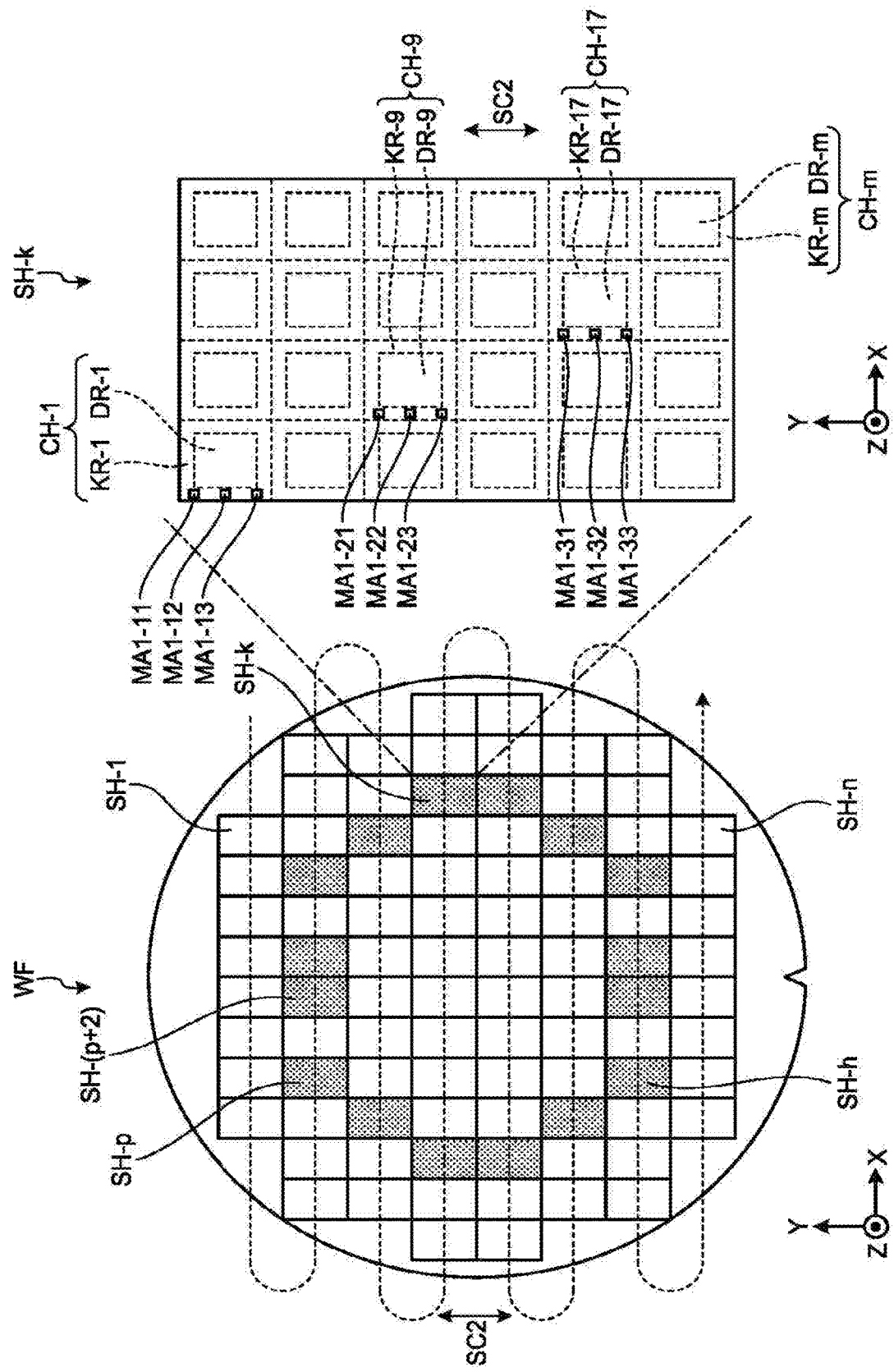

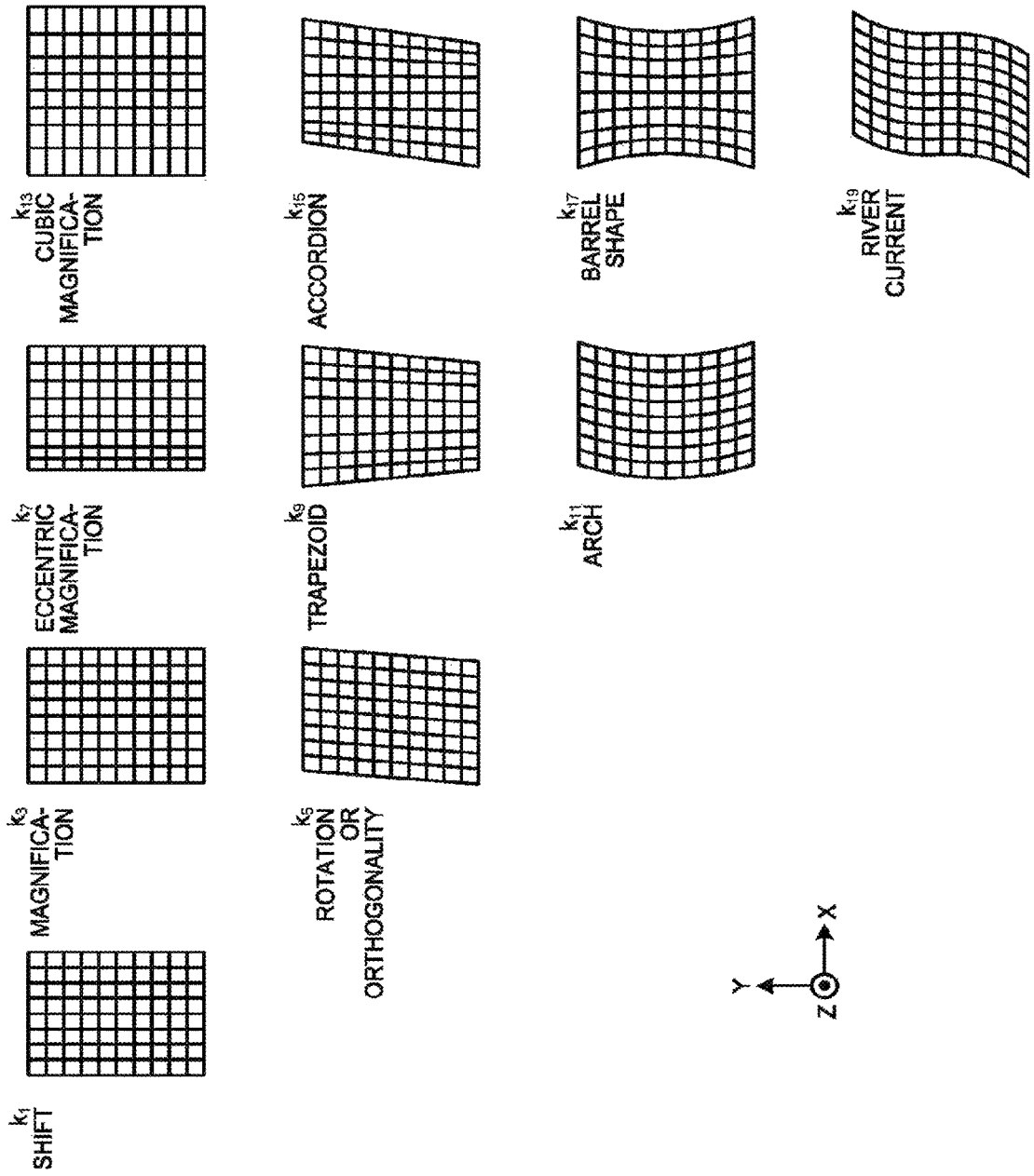

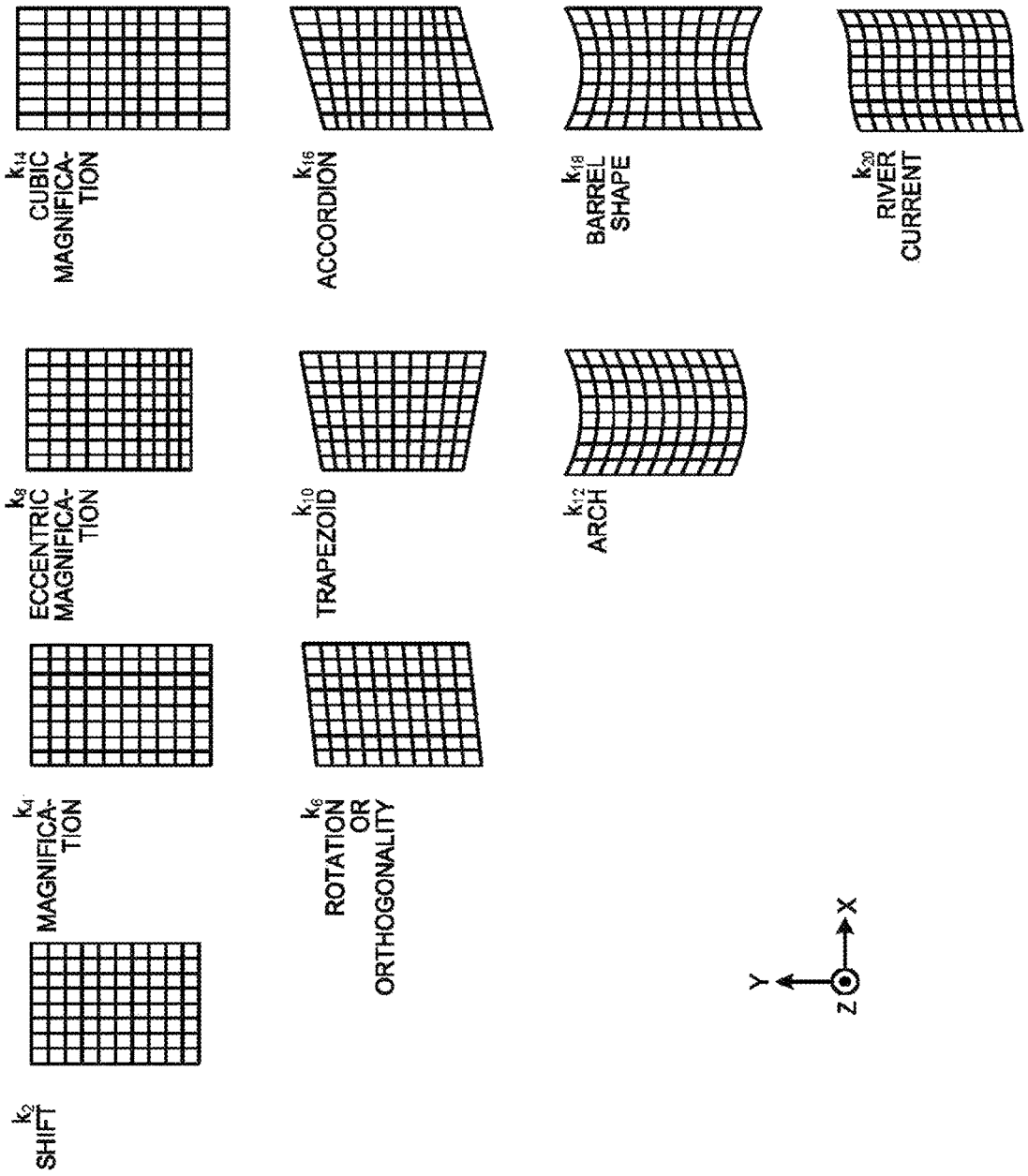

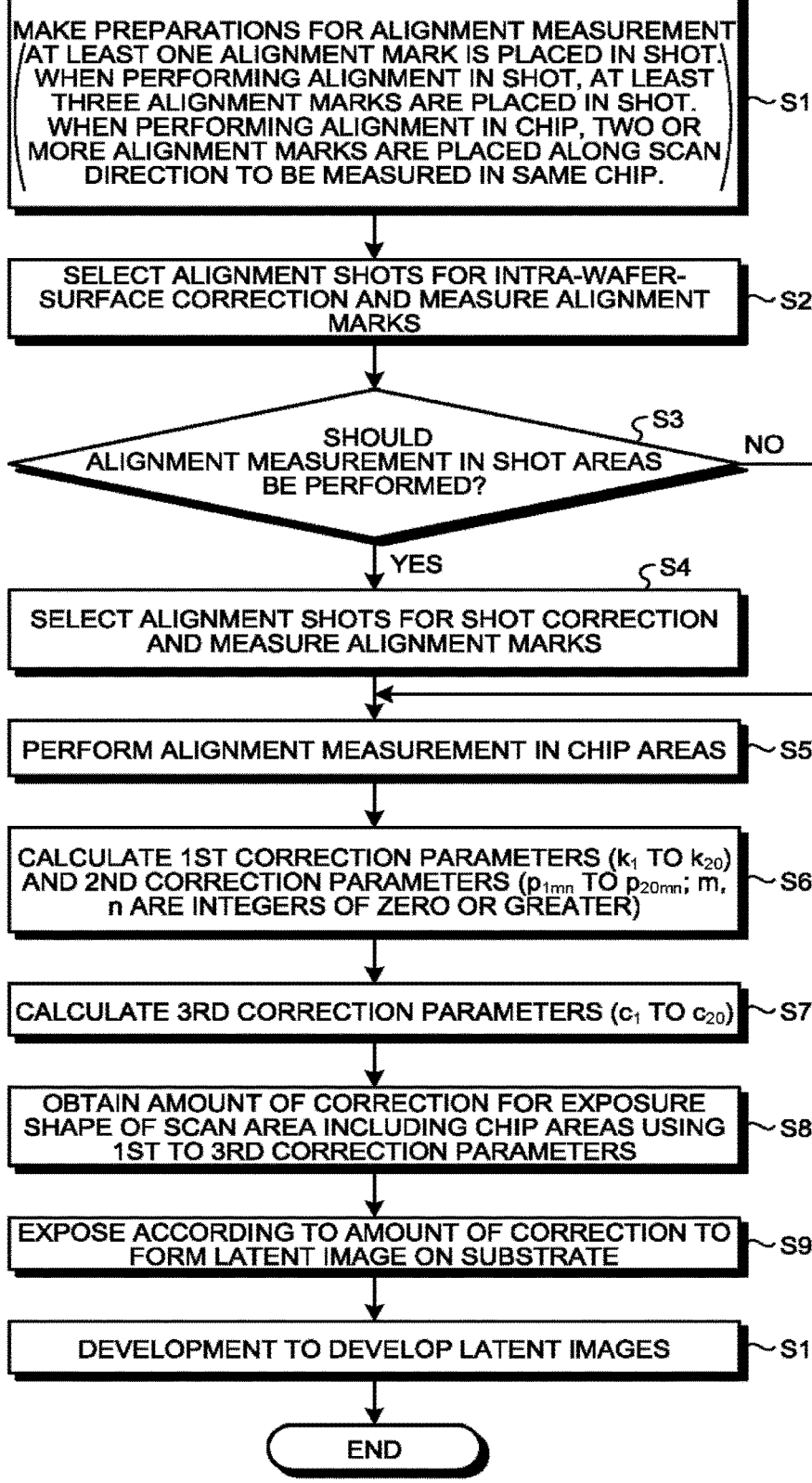

EXPOSURE APPARATUS, EXPOSURE METHOD, AND SEMICONDUCTOR DEVICE MANUFACTURING METHOD

CROSS-REFERENCE TO RELATED APPLICATIONS

This application is based upon and claims the benefit of priority from Japanese Patent Application No. 2018-037666, filed on Mar. 2, 2018; the entire contents of which are incorporated herein by reference.

FIELD

Embodiments described herein relate generally to an exposure apparatus, an exposure method, and a semiconductor device manufacturing method.

BACKGROUND

In exposure apparatuses, patterns of originals are projected onto a substrate by a projection optical system so that the substrate is exposed, thereby transferring the patterns of the originals onto the substrate. In this case, it is desired to perform alignment between the patterns on the substrate with high accuracy.

BRIEF DESCRIPTION OF THE DRAWINGS

FIGS. 2A and 2B are a perspective view illustrating the configuration of the exposure apparatus according to the embodiment;

FIGS. 3A and 3B are plan views illustrating the configuration of shot areas on a substrate in the embodiment;

FIG. 4 is a diagram illustrating parameters related to the amount of positional deviation in an X direction in the embodiment;

FIG. 5 is a diagram illustrating parameters related to the amount of positional deviation in a Y direction in the embodiment;

FIG. 6 is a flow chart illustrating the operation of the exposure apparatus according to the embodiment;

DETAILED DESCRIPTION

Figure 1:
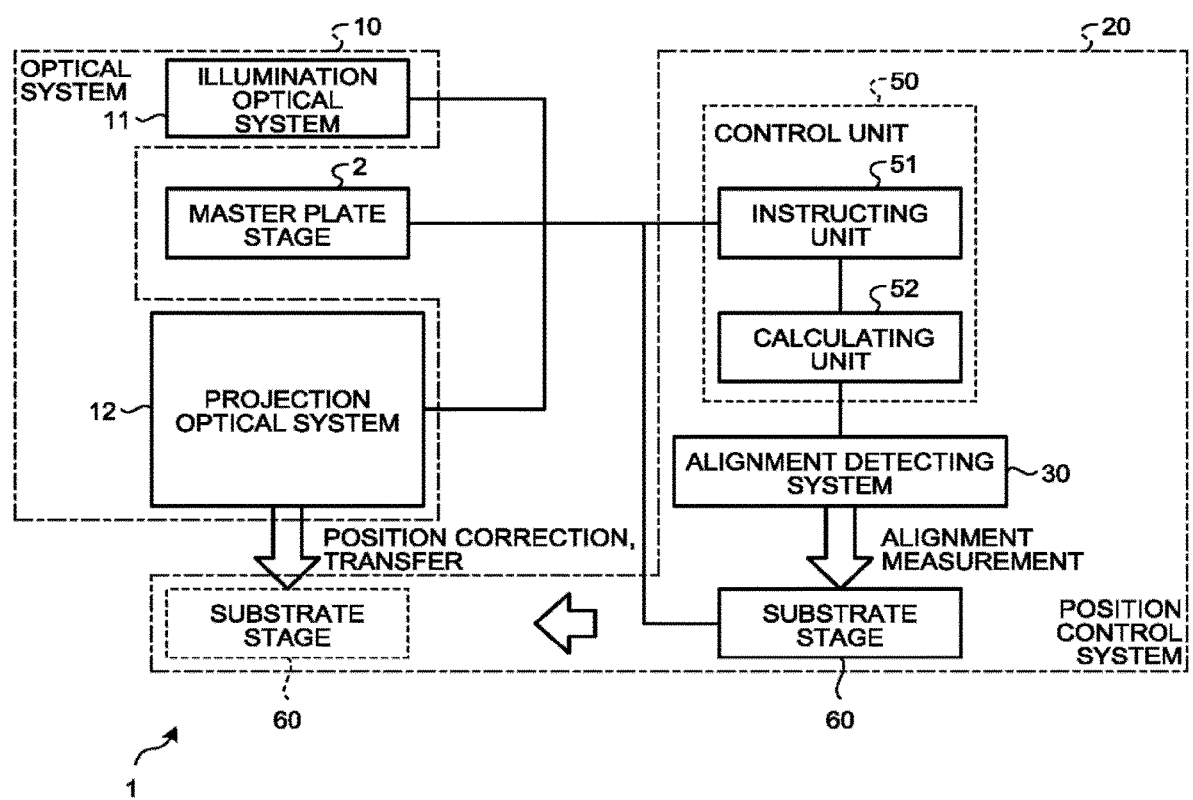
FIG. 1 is a block diagram illustrating the configuration of an exposure apparatus according to an embodiment.

In general, according to one embodiment, there is provided an exposure apparatus which projects a pattern of an original onto a substrate by a projection optical system so as to expose the substrate. The exposure apparatus includes a substrate stage, an alignment detecting system, and a controller. The substrate stage holds the substrate on which shot areas each including multiple chip areas are placed. The alignment detecting system detects multiple first alignment marks placed in a peripheral region in a first chip area in the shot area. The controller obtains the first amount of positional deviation for the first chip area according to results of detecting the multiple first alignment marks and controls exposure conditions for the first chip area in the shot area according to the first amount of positional deviation.

Exemplary embodiments of an exposure apparatus will be explained below in detail with reference to the accompanying drawings. The present invention is not limited to the following embodiments.

Embodiment

An exposure apparatus according to an embodiment is applied to exposure processes in a semiconductor device manufacturing method. In the exposure processes, the exposure apparatus projects patterns of originals onto a substrate by a projection optical system so as to expose the substrate, thereby transferring the patterns of the originals onto the substrate. In this case, it is desired to perform alignment between the patterns on the substrate with high accuracy. Hence, the exposure apparatus has an alignment function for performing alignment between the patterns. The exposure apparatus can align a shot area with respect to the exposure apparatus using the alignment function. In this case, in order to improve the throughput of the exposure processes, the shot area can be formed to include multiple chip areas.

Meanwhile, in a semiconductor device such as a three-dimensional memory, a laminated body having insulating layers and conductive layers alternately stacked one over another may be placed on a substrate and penetrated by columnar-shaped semiconductor columns to form a three-dimensional arrangement of memory cells. As to this semiconductor device, the storage capacity can be increased by increasing the number of stacked layers, and hence the necessity of using a more advanced patterning technique can be reduced, so that the cost per bit can be easily reduced.

This semiconductor device is configured such that the intersections of conductive layers and semiconductor columns function as memory cells, so that a memory array in which the plurality of memory cells are arranged three-dimensionally is formed. Part of the conductive layer intersecting with a semiconductor column functions as a control gate in a memory cell, and the remaining part of the conductive layer can function as a word line to transmit a signal to the control gate. Where a plurality of laminated bodies are arranged on a substrate, an insulating material is filled into grooves between the laminated bodies to form element-isolating portions electrically separating a laminated body front the other laminated bodies.

In this semiconductor device, increasing the number of stacked conductive layers in the laminated body in order to increase the storage capacity causes film stress to be likely to occur in an area including the laminated body, so that pattern positional deviation due to the film stress may occur. For example, because the film configuration is different between the memory array and the element-isolating portion, the differences in stress between the chip areas in the shot area may be large, so that the amount of positional deviation may be different for each chip area. Thus, when alignment measurement and alignment correction according to the detecting results are performed on a shot-area unit basis, alignment accuracy (accuracy in aligning) may degrade.

Accordingly, in the present embodiment, in the exposure apparatus, the amount of positional deviation of a predetermined chip area in the shot area including multiple chip areas is obtained by alignment measurement, and exposure conditions for the predetermined chip area is controlled according to that amount of positional deviation so as to improve alignment accuracy.

Specifically, the exposure apparatus is a scanning exposure apparatus, and as to exposure conditions for a scan area in scanning exposure including the chip area on which alignment measurement was performed, chip shapes are corrected using the results of alignment measurement. For example, for the amount of alignment deviation caused by stress due to stacked films (insulating layers and conductive layers) that occurs on a chip-unit basis, by performing scan position control in the scan direction of the exposure apparatus, the exposure shapes of the chip areas are corrected. Two or more alignment marks per chip area are placed along the scan direction in order to calculate the amount of positional deviation to be used in this correction, and alignment measurement is performed to detect the alignment marks. A plurality of error components such as a chip magnification component are calculated as the amount of positional deviation from the results of this alignment measurement, and exposure-condition control such as magnification control along the scan direction is executed to correct for each error component. By this means, the error components due to the film stress can be corrected for by the exposure apparatus. By this correction, good accuracy in aligning (alignment accuracy) can be achieved even in a process where film stress in the shot area is large.

More specifically, the exposure apparatus 1 is configured as shown in FIGS. 1, 2A, and 2B. FIG. 1 is a block diagram illustrating the configuration of the exposure apparatus 1. FIG. 2A is a perspective view illustrating the configuration of the exposure apparatus 1. FIG. 2B is a diagram illustrating a picked-up image of an alignment mark.

The exposure apparatus 1 is, for example, a scanning exposure apparatus (scanner). The scanning exposure apparatus is an apparatus which, while synchronously moving an original (mask) MK and a substrate (wafer) WF in scan directions SC1, SC2, projects, by exposure, a pattern drawn on the original MK onto the substrate WF subject to exposure. Hereinafter, let a +Z direction be the direction going away from the substrate WF along the optical axis PA of a projection optical system 12. Let a Y direction be the synchronous movement direction (scan direction) of the original MK and the substrate WF in a plane perpendicular to the Z direction. Let an X direction be a direction (non-scan direction) perpendicular to the Z direction and Y direction. Further, let a θX direction, θY direction, and θZ direction be directions around the X axis, Y axis, and Z axis respectively.

The exposure apparatus 1 includes an optical system 10, an master plate stage 2, and a position control system 20. The optical system 10 includes an illumination optical system 11 and the projection optical system 12. The position control system 20 includes a focus detecting system (not shown), an alignment detecting system 30, a control unit 50, and a substrate stage 60.

The illumination optical system 11, the master plate stage 2, and the projection optical system 12 are arranged with the optical axis PA as their center. The optical axis PA is an axis indicating the direction in which the chief ray of exposure light travels from a light source LS to the substrate WF.

The substrate stage 60 has a chuck mechanism 62 (e.g., a vacuum chuck or electrostatic chuck) and holds the substrate WF using the chuck mechanism 62. A photosensitive material (resist) R is coated on the substrate WF. For example, an alignment mark MA1 is formed on the substrate WF before the photosensitive material R is coated thereon.

The substrate stage 60, while holding the substrate WF, moves in the X, Y, and Z directions and rotates in the θX, θY, and θZ directions. By this means, the substrate stage 60 positions the substrate WF. A fiducial mark 61 is formed on the top of the substrate stage 60.

The master plate stage 2 is placed in the +Z direction of the substrate stage 60 with the projection optical system 12 in between. The master plate stage 2 has a chuck mechanism 21 (e.g., a vacuum chuck or electrostatic chuck) and holds the original MK using the chuck mechanism 21. For example, the pattern of an alignment mark MA2 as well as a circuit pattern to be transferred is drawn on the original MK.

The projection optical system 12 projects, by exposure, light incident on the original MK onto the substrate WF to form an image according to the pattern drawn on the original MK on the substrate WF. The projection optical system 12 can change the magnification of the projected image projected onto the substrate WF.

The illumination optical system 11 is placed in the +Z direction of the master plate stage 2. The illumination optical system 11 includes an illumination lens 11a and a slit plate 11b. The illumination lens 11a illuminates an illumination area of the original MK with exposure light LX having a uniform illumination distribution. The slit plate 11b has a slit 11b1 provided therein and shapes exposure light LX having passed through the illumination lens 11e into a slit shape by the slit 11b1. That exposure light LX is diffracted by the pattern drawn on the original MK and incident on the projection optical system 12.

The focus detecting system (not shown) performs focus measurement to detect the position (surface position) along the Z direction (height direction) of the substrate WF.

The alignment detecting system 30 performs alignment measurement to detect the position in the X and Y directions (surface direction position) of the substrate WF. The alignment detecting system 30 can detect the position in the X and Y directions of the substrate WF with respect to the exposure apparatus 1 with the fiducial mark 61 on the substrate stage 60 as a reference.

The alignment detecting system 30 includes an alignment sensor 31 and a reflecting system 32. The alignment sensor 31 includes a projecting system 31a and a light receiving system 31b. The projecting system 31a generates measurement light such as laser light (visible light or infrared light) and irradiates the light onto the alignment marks MA1, MA2 through the reflecting system 32. The measurement light reflected by the alignment marks MA1, MA2 is received by the light receiving system 31b through the reflecting system 32, so that a signal according to an image IM formed by the received light is supplied to the control unit 50.

The control unit 50 controls the constituents of the exposure apparatus 1 comprehensively. For example, the control unit 50 recognizes patterns MB1, MB2 corresponding to the alignment marks MA1, MA2 contained in the image IM received from the alignment detecting system 30 to obtain the amount of positional deviation with respect to an area subject to alignment measurement according to the positions of the patterns MB1, MB2 in the image IM. The control unit 50 controls exposure conditions for an area (the scan area to be scan-exposed) corresponding to the area subject to alignment measurement according to the obtained amount of positional deviation. At least any one of the projection magnification of the projection optical system 12 (the magnification of the projected image projected onto the substrate WF), the relative scan speed of the original MK and the substrate WF (the scan speed of the substrate stage 60 relative to the original MK), the inclination of the substrate WF relative to the original MK (the inclination of the substrate stage 60 relative to the original MK), and the rotation angle of the substrate WF relative to the original MK (the rotation angle of the substrate stage 60 relative to the original MK) can be selected as these exposure conditions.

The control unit 50 includes an instructing unit 51 and a calculating unit 52. The instructing unit 51 includes an aligning unit 51a and a scan control unit 51b. The calculating unit 52 includes a positional deviation compensating unit 52a. The aligning unit 51a aligns a reticle 14 and the shot area SH based on the detected positions of the alignment marks MA1, MA2. The scan control unit 51b performs scan control of the reticle 14 and the stage 60. The scan control unit 51b can synchronize the scan in the scan direction SC1 of the original MK and the scan in the scan direction SC2 of the stage 60. The positional deviation compensating unit 52a performs exposure control of the scan area corresponding to a chip area based on the amount of positional deviation of the chip area. At this time, the parameters of exposure conditions for the scan area corresponding to the chip area can be corrected based on the amount of positional deviation of the chip area.

For example, the control unit 50 controls the alignment detecting system 30 to perform alignment measurement to detect the amount of positional deviation of the substrate WF in order to set a target position in transfer (a placement position according to layout design data) for the substrate WF. The amount of positional deviation is detected by the alignment sensor 31. Information about the detected amount of positional deviation is supplied to the calculating unit 52, and the calculating unit 52 sets a target position for both shot areas sampled and shot areas not sampled. The target position is set using parameters obtained from computation expressions using a rectangular coordinate system or a polar coordinate system. The set parameters are supplied from the calculating unit 52 to the instructing unit 51. The instructing unit 51 generates control signals according to the parameters to supply to the illumination optical system 11, the master plate stage 2, the projection optical system 12, and the substrate stage 60 to cause them to operate, thereby performing position correction (correction of the exposure shapes of chip areas).

Next, the configuration of the shot areas on the substrate WF will be described using FIGS. 3A and 3B. FIGS. 3A and 3B are plan views illustrating the configuration of the shot areas on the substrate WF.

As shown in FIG. 3A, multiple shot areas SH-1 to SH-n, where n is an integer of two or greater, are set up on the substrate WF. The shot areas SH-1 to SH-n can be made to correspond to the projection coverage of the original MK used in the exposure apparatus 1. At this time, the scan direction SC2 of the exposure apparatus 1 can be set such that all the shot areas SH-1 to SH-n on the substrate WF are scanned sequentially in the order indicated by, e.g., a broken-line arrow in FIG. 3A. In the case of FIG. 3A, the scan direction SC2 can be set to be ±Y direction.

From among all the shot areas SH-1 to SH-n, shot areas SH-p, SH-(p+2), . . . , SH-k, . . . , SH-h indicated by gray in FIG. 3A, where p is an integer of two or greater that is smaller than n, k is an integer of two or greater that is greater than p and smaller than n, and h is an integer of two or greater that is greater than k and smaller than n, are selected as being subject to alignment measurement, and multiple alignment marks MA1 can be placed in each of the shot areas SH-p to SH-h subject to alignment measurement.

For example, as shown in FIG. 3B, each shot area SH on the substrate WF includes multiple chip areas CH-1 to CH-m, where m is an integer of two or greater. Each chip area CH includes a device region DR and a kerf region KR. The kerf region KR is a region (peripheral region) placed around the device region DR.

Each shot area SH-p to SH-h subject to alignment measurement includes multiple chip areas subject to alignment measurement. For example, the shot area SH-k includes multiple chip areas CH-1, CH-9, CH-17 subject to alignment measurement shown in FIG. 3B. The multiple chip areas CH-1, CH-9, CH-17 subject to alignment measurement are placed in positions shifted in the scan direction SC2 (Y direction) relative to each other in the shot area SH.

The chip area CH-1 has multiple alignment marks MA1-11, MA1-12, MA1-13. The multiple alignment marks MA1-11, MA1-12, MA1-13 are placed in positions shifted in the scan direction SC2 relative to each other in the kerf region KR-1 of the chip area CH-1.

The chip area CH-9 has multiple alignment marks MA1-21, MA1-22, MA1-23. The multiple alignment marks MA1-21, MA1-22, MA1-23 are placed in positions shifted in the scan direction SC2 relative to each other in the kerf region KR-9 of the chip area CH-9.

The chip area CH-17 has multiple alignment marks MA1-31, MA1-32, MA1-33. The multiple alignment marks MA1-31, MA1-32, MA1-33 are placed in positions shifted in the scan direction SC2 relative to each other in the kerf region KR-17 of the chip area CH-17.

The exposure apparatus 1 can obtain results of alignment measurement in the substrate surface by measuring an alignment mark representative of the shot area SH (e.g., alignment mark MA1-11) for each shot area SH-p to SH-h subject to alignment measurement or so on. Further, the exposure apparatus 1 can obtain results of alignment measurement in the shot area by measuring the multiple alignment marks MA1-11, MA1-21, MA1-31 placed in the shot area SH or so on. Yet further, the exposure apparatus 1 can obtain results of alignment measurement in the chip area by measuring the multiple alignment marks MA1-11, MA1-12, MA1-13 placed in the chip area CH-1 or so on.

Then the exposure apparatus 1 substitutes the results of alignment measurement in the substrate surface and the results of alignment measurement in the shot area into a shot correction expression and an intra-substrate-surface correction expression and calculates first correction parameters ($k_1$ to $k_{20}$) and second correction parameters ($P_{1mn}$ to $P_{20mn}$; m, n are integers of zero or greater). As example correction expressions using rectangular coordinates (X, Y coordinates), the shot correction expression can be expressed by the following equation (1), and the intra-substrate-surface correction expression can be expressed by the following equation (2).

$$dx = k_1 + k_3 x + k_5 y + k_7 x^2 + k_9 xy + k_{11} y^2 + k_{13} x^3 + k_{15} x^2 y + k_{17} xy^2 + k_{19} y^3 \\ dy = k_2 + k_4 y + k_6 x + k_8 y^2 + k_{10} xy + k_{12} x^2 + k_{14} y^3 + k_{16} xy^2 + k_{18} x^2 y + k_{20} x^3 \quad \bigg\} \quad (1)$$

$$\begin{aligned}
k_1 &= \sum_{m,n=0}^{m,n} P_{1mn} X^m Y^n + \alpha_1 & k_2 &= \sum_{m,n=0}^{m,n} P_{2mn} X^m Y^n + \alpha_2 & k_3 &= \sum_{m,n=0}^{m,n} P_{3mn} X^m Y^n + \alpha_3 \\
k_4 &= \sum_{m,n=0}^{m,n} P_{4mn} X^m Y^n + \alpha_4 & k_5 &= \sum_{m,n=0}^{m,n} P_{5mn} X^m Y^n + \alpha_5 & k_6 &= \sum_{m,n=0}^{m,n} P_{6mn} X^m Y^n + \alpha_6 \\
k_7 &= \sum_{m,n=0}^{m,n} P_{7mn} X^m Y^n + \alpha_7 & k_8 &= \sum_{m,n=0}^{m,n} P_{8mn} X^m Y^n + \alpha_8 & k_{10} &= \sum_{m,n=0}^{m,n} P_{10mn} X^m Y^n + \alpha_{10} \\
k_{11} &= \sum_{m,n=0}^{m,n} P_{11mn} X^m Y^n + \alpha_{11} & k_{12} &= \sum_{m,n=0}^{m,n} P_{12mn} X^m Y^n + \alpha_{12} & k_{13} &= \sum_{m,n=0}^{m,n} P_{13mn} X^m Y^n + \alpha_{13} \\
k_{14} &= \sum_{m,n=0}^{m,n} P_{14mn} X^m Y^n + \alpha_{14} & k_{15} &= \sum_{m,n=0}^{m,n} P_{15mn} X^m Y^n + \alpha_{15} & k_{16} &= \sum_{m,n=0}^{m,n} P_{16mn} X^m Y^n + \alpha_{16} \\
k_{17} &= \sum_{m,n=0}^{m,n} P_{17mn} X^m Y^n + \alpha_{17} & k_{18} &= \sum_{m,n=0}^{m,n} P_{18mn} X^m Y^n + \alpha_{18} & k_{19} &= \sum_{m,n=0}^{m,n} P_{19mn} X^m Y^n + \alpha_{19} \\
k_{20} &= \sum_{m,n=0}^{m,n} P_{20mn} X^m Y^n + \alpha_{20}
\end{aligned} \quad (2)$$

The first correction parameters ($k_1$ to $k_{20}$) and second correction parameters ($P_{1mn}$ to $P_{20mn}$; m, n are integers of zero or greater) are parameters related to the amount of positional deviation from the target position of an exposure subject (a placement position according to layout design data) and denote, for example, error components for the exposure shape of a given subject area. That is, in correcting the exposure shape, the first and second correction parameters can be regarded as parameters denoting to what degree to control the constituents of the exposure apparatus 1 (the illumination optical system 11, master plate stage 2, projection optical system 12, and substrate stage 60) in order to perform that correction. The exposure apparatus 1 can determine a target position and a scan drive amount using the first and second correction parameters and determine the control amount for the constituents of the exposure apparatus 1 (the illumination optical system 11, master plate stage 2, projection optical system 12, and substrate stage 60) according to the determined target position and scan drive amount so as to execute exposure of the substrate WF.

Specifically, in the equation (1), (X, Y) are shot center coordinates in a substrate coordinate system in any shot area SH on the substrate WF; (x, y) are positional deviation measuring-point coordinates in an intra-shot coordinate system in the shot area SH; and (dx, dy) are the amount of positional deviation at the positional deviation measuring point. For each shot area subject to positional deviation measurement, such first correction parameters ($k_1$ to $k_{20}$) that residues $\alpha_1$ to $\alpha_{20}$ of the equation (2) become minimal are calculated.

The $k_1$, $k_2$ obtained from the equation (1) correspond to shift components of the shot area SH; $k_3$, $k_4$ correspond to magnification components of the shot area SH; $k_5$, $k_6$ correspond to rotation components of the shot area SH; $k_7$ to $k_{12}$ correspond to linear components of quadratic positional deviation of the shot area SH; and $k_{13}$ to $k_{19}$ correspond to linear components of cubic positional deviation of the shot area SH.

If a pair of alignment marks MA1 is in the shot area SH, the $k_1$, $k_2$ are obtained. If a pair of a for-X alignment mark MA1 and a for-Y alignment mark MA1 is in the shot area, the shape of the shot area SH cannot be measured, but if there are three or more pairs of a for-X alignment mark MA1 and a for-Y alignment mark MA1, the parameters $k_1$ to $k_6$ are obtained. If there are six or more pairs of a for-X alignment mark MA1 and a for-Y alignment mark MA1, the $k_1$ to $k_{12}$ are obtained. If there are ten or more pairs of a for-X alignment mark MA1 and a for-Y alignment mark MA1, the $k_1$ to $k_{20}$ are obtained.

The shape of the shot area SH can be calculated from the first correction parameters ($k_1$ to $k_{20}$) obtained from the equation (1).

For example, $k_1$, $k_3$, $k_5$, $k_7$, $k_9$, $k_{11}$, $k_{13}$, $k_{15}$, $k_{17}$, $k_{19}$ used in the equations (1) and (2) are first correction parameters related to the amount of positional deviation in the X direction in rectangular coordinates (X, Y coordinates) as shown in FIG. 4. FIG. 4 is a diagram illustrating parameters related to the amount of positional deviation in the X direction. The $k_1$, $k_3$, $k_5$, $k_7$, $k_9$, $k_{11}$, $k_{13}$, $k_{15}$, $k_{17}$, $k_{19}$ denote error components of the X direction that can be adjusted by the exposure apparatus 1. The $k_1$ can denote a shift component of the X direction; $k_3$ a magnification component of the X direction; $k_5$ a rotation component of the X direction (or an orthogonality component of the X direction); $k_7$ an eccentric magnification component of the X direction; $k_9$ a trapezoid component of the X direction; $k_{11}$ an arch component of the X direction; $k_{13}$ a cubic magnification component of the X direction; $k_{15}$ an accordion component of the X direction; $k_{17}$ a barrel-shape component of the X direction; and $k_{19}$ can denote a river-current component of the X direction.

Likewise, $k_2$, $k_4$, $k_6$, $k_8$, $k_{10}$, $k_{12}$, $k_{14}$, $k_{16}$, $k_{18}$, $k_{20}$ used in the equations (1) and (2) are first correction parameters related to the amount of positional deviation in the Y direction in rectangular coordinates (X, Y coordinates) as shown in FIG. 5. FIG. 5 is a diagram illustrating parameters related to the amount of positional deviation in the Y direction. The $k_2$, $k_4$, $k_6$, $k_8$, $k_{10}$, $k_{12}$, $k_{14}$, $k_{16}$, $k_{18}$, $k_{20}$ denote error components of the Y direction that can be adjusted by the exposure apparatus 1. The $k_2$ can denote a shift component of the Y direction; $k_4$ a magnification component of the Y direction; $k_6$ a rotation component of the Y direction (or an orthogonality component of the Y direction); $k_8$ an eccentric magnification component of the Y direction; $k_{10}$ a trapezoid component of the Y direction; $k_{12}$ an arch component of the Y direction; $k_{14}$ a cubic magnification component of the Y direction; $k_{16}$ an accordion component of the Y direction; $k_{18}$ a barrel-shape component of the Y direction; and $k_{20}$ can denote a river-current component of the Y direction.

The first correction parameters ($k_1$ to $k_{20}$) obtained from each shot area SH subject to measurement and the center coordinates (X, Y) of the shot area subject to measurement in the intra-substrate-surface coordinate system are input into the equation (2), and such second correction parameters ($P_{1mn}$ to $P_{20mn}$; m, n are integers of zero or greater) that the residues $\alpha_1$ to $\alpha_{20}$ become minimal are calculated.

The equation (2) is a function of intra-substrate-surface coordinates (X, Y). In this equation, "m+n" corresponds to the degree of the XY function. As this degree becomes higher, the fitting accuracy of alignment correction values improves. However, as KY values of the XY function become greater, the amount of correction becomes greater, so that, at the outer periphery of the substrate WF, the divergence between the amount of correction and the true amount of alignment deviation may be large.

The exposure apparatus 1 substitutes the result of alignment measurement in a chip area into a chip correction expression and performs least square approximation to calculate such third correction parameters ($C_1$ to $C_{20}$) that the residues become minimal. As an example correction expression using rectangular coordinates (X, Y coordinates), the chip correction expression can be expressed by the following equation (3).

$$dcy = C0 + C1cy + C2cy^2 + C3cy^3 + \ldots + C20cy^{20} \quad (3)$$

In the equation (3), dcy is the amount of positional deviation of an intra-chip measuring point, and cy is a Y-coordinate in an intra-chip coordinate system. Because the alignment marks MA1-11 to MA1-13 in the chip area CH are placed in positions shifted in the Y direction relative to each other according to the scan direction SC2 of the exposure apparatus 1 being ±Y direction, the result of alignment measurement in the chip area CH is the amount of positional deviation in the Y direction (dcy). The exposure apparatus 1 can calculate the third correction parameters ($C_1$ to $C_{20}$) using the equation (4) for each chip area for which alignment measurement was performed.

Then the exposure apparatus 1 can correct the exposure shape for each scan area including the chip areas by changing the first correction parameters ($k_1$ to $k_{20}$), the second correction parameters ($P_{1m}$ to $P_{20mn}$; m, n are integers of zero or greater), and the third correction parameters ($C_1$ to $C_{20}$). That is, the exposure apparatus 1 can, for each scan area including the chip areas, perform control to change the relative scan speed of the substrate stage 60 relative to the original MK, the inclination of the substrate stage 60 relative to the original MK, the rotation angle of the substrate stage 60 relative to the original MK, the magnification of a projected image projected onto the substrate WF (the projection magnification of the projection optical system 12), and the like.

Next, the operation of the exposure apparatus 1 will be described using FIG. 6. FIG. 6 is a flow chart illustrating the operation of the exposure apparatus 1.

First, preparations for alignment measurement are made (S1). Specifically, at least one alignment mark is placed in the shot area for alignment measurement in the substrate surface. For example, an alignment mark MA2 (see FIG. 2) representative of the shot area is drawn in the shot area on the original MK by a mask creating apparatus such as an electron-beam drawing apparatus. Further, in a shot area SH on the substrate WF, an alignment mark MA1 (see FIG. 2) representative of the shot area is formed by the exposure apparatus 1 and a developing apparatus (not shown). In the case of the shot area SH-k shown in FIG. 3B, the alignment mark MA1-11 as an alignment mark MA1 representative of the shot area SH-k can be formed in the shot area SH-k.

When performing alignment measurement in a shot area, at least three alignment marks are placed in the shot area. For example, multiple alignment marks MA2 (see FIG. 2) are drawn in the shot area on the original MK by the mask creating apparatus such as an electron-beam drawing apparatus. Further, multiple alignment marks MA1 (see FIG. 2) are formed in a shot area SH on the substrate WF by the exposure apparatus 1 and a developing apparatus (not shown). In the case of the shot area SH-k shown in FIG. 3B, multiple alignment marks MA1-11, MA1-21, MA1-31 can be formed in positions shifted in the scan direction SC2 relative to each other in the shot area SH-k.

When performing alignment measurement in a chip area, two or more alignment marks MA2 are placed in positions shifted in the scan direction in the chip area. For example, multiple alignment marks MA2 (see FIG. 2) are drawn in a chip area in the shot area on the original MK by the mask creating apparatus such as an electron-beam drawing apparatus. Further, multiple alignment marks MA1 (see FIG. 2) are formed in a chip area CH in a shot area SH on the substrate WF by the exposure apparatus 1 and a developing apparatus (not shown). In the case of the shot area SH-k shown in FIG. 3B, multiple alignment marks MA1-11, MA1-12, MA1-13 can be formed in positions shifted in the scan direction SC2 relative to each other in the chip area CH-1. Multiple alignment marks MA1-21, MA1-22, MA1-23 can be formed in positions shifted in the scan direction SC2 relative to each other in the chip area CH-9. Multiple alignment marks MA1-31, MA1-32, MA1-33 can be formed in positions shifted in the scan direction SC2 relative to each other in the chip area CH-17.

The exposure apparatus 1 selects shot areas SH subject to alignment measurement for intra-substrate-surface correction and measures alignment marks MA1 representative of the shot areas SH (S2). For example, the shot areas SH-p, SH-(p+2), . . . , SH-k, . . . , SH-h indicated by gray in FIG. 3A, where p is an integer of two or greater that is smaller than n, k is an integer of two or greater that is greater than p and smaller than n, and h is an integer of two or greater that is greater than k and smaller than n, are selected as being subject to alignment measurement. An alignment mark MA1 representative of the shot area SH of each shot area SH-p to SH-h subject to alignment measurement (in the case of the shot area SH-k, the alignment mark MA1-11) is measured.

If determining that alignment measurement in shot areas SH should be performed (Yes at S3), the exposure apparatus 1 selects shot areas SH subject to measurement for shot correction and measures alignment marks MA1 for shot correction in the selected shot areas SH (S4). For example, the shot areas SH-p, SH-(p+2), . . . , SH-k, . . . , SH-h indicated by gray in FIG. 3A, where p is an integer of two or greater that is smaller than n, k is an integer of two or greater that is greater than p and smaller than n, and h is an integer of two or greater that is greater than k and smaller than n, are selected as being subject to alignment measurement. Alignment marks MA1 for shot correction in each shot area SH-p to SH-h subject to alignment measurement (in the case of the shot area SH-k, the alignment marks MA1-11, MA1-21, MA1-31) are measured. Then, after measuring alignment marks MA1 for shot correction, the exposure apparatus 1 performs alignment measurement in chip areas CH. For example, the shot areas SH-p, SH-(p+2), . . . , SH-k, . . . , SH-h indicated by gray in FIG. 3A, where p is an integer of two or greater that is smaller than n, k is an integer of two or greater that is greater than p and smaller than n, and h is an integer of two or greater that is greater than k and smaller than n, are selected as being subject to alignment measurement. Alignment marks MA1 for chip correction in each chip area CH of each shot area SH-p to SH-h subject to alignment measurement (in the case of the chip area CH-1 of the shot area SH-k, the alignment marks MA1-11, MA1-12, MA1-13) are measured.

If, as to alignment measurement for shot correction, a first condition (e.g., the condition that the preceding measuring results can be diverted for use) or a second condition (e.g., the condition that default measuring results can be used without causing any problem) is satisfied, it is determined that alignment measurement in shot areas SH need not be performed (No at S3), and without performing alignment measurement for shot correction (S4), alignment measurement in chip areas CH is performed (S5).

The exposure apparatus 1 substitutes the results of alignment measurement in a shot area SH into the equations (1), (2) to calculate the first correction parameters ($k_1$ to $k_{20}$) and the second correction parameters ($P_{1mn}$ to $P_{20mn}$; m, n are integers of zero or greater) (S6). For example, when performing alignment measurement for shot correction (S4), the exposure apparatus 1 substitutes the measuring results into the equations (1), (2) to calculate the first correction parameters and the second correction parameters. If the first condition is satisfied, the exposure apparatus 1 substitutes the preceding measuring results into the equations (1), (2) to calculate the first correction parameters and the second correction parameters. If the second condition is satisfied, the exposure apparatus 1 substitutes default measuring results into the equations (1), (2) to calculate the first correction parameters and the second correction parameters.

Further, the exposure apparatus 1 substitutes the result of alignment measurement in a chip area CH into the equation (3) to calculate the third correction parameters ($C_1$ to $C_{20}$) (S7). For example, the exposure apparatus 1 substitutes the intra-chip coordinate value of the Y direction of a measuring point and the amount of positional deviation measured at S5 into the equation (3) to perform least square approximation to calculate such third correction parameters ($C_1$ to $C_{20}$) that the residues become minimal.

Then the exposure apparatus 1 obtains the amount of correction for the exposure shape of the scan area including the chip areas CH using the first correction parameters, the second correction parameters, and the third correction parameters (S8). That is, the exposure apparatus 1 can, for each scan area including chip areas CH, obtain the amounts of correction for the relative scan speed of the substrate stage 60 relative to the original MK, the inclination of the substrate stage 60 relative to the original MK, the rotation angle of the substrate stage 60 relative to the original MK, the magnification of a projected image projected onto the substrate WF (the projection magnification of the projection optical system 12), and the like so as to cancel out the influence of the amount of positional deviation.

The exposure apparatus 1, while synchronously moving the original (mask) MK and the substrate (wafer) WF in the scan directions SC1, SC2 according to the amounts of correction obtained at S8, exposes the scan area in the substrate WF to form a latent image according to the pattern of the original MK on the substrate WF (S9).

Figure 7A:
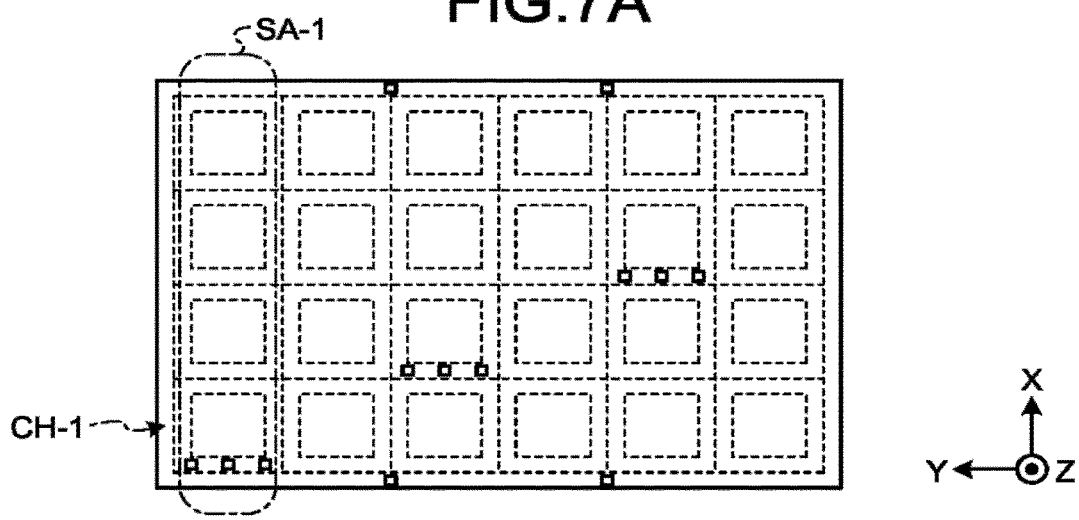
FIGS. 7A to 7C are diagrams illustrating scan areas in scanning exposure in the embodiment.

For example, as shown in FIG. 7A, the exposure apparatus 1 corrects the exposure shape of the chip area CH-1 according to the amount of positional deviation of the chip area CH-1 during the period when the scan area SA-1 corresponding to the chip area CH-1 is scanned. FIG. 7A is a diagram illustrating the scan area SA-1 in scanning exposure by the exposure apparatus 1. That is, the exposure apparatus 1 performs at least one of correcting the projection magnification of the projection optical system 12, correcting the relative scan speed of the original MK and the substrate WF, correcting the inclination of the substrate WF relative to the original MK, and correcting the rotation angle of the substrate WF relative to the original MK according to the amount of positional deviation of the chip area CH-1 during the period when the scan area SA-1 including the chip area CH-1 is scanned.

Figure 8A:
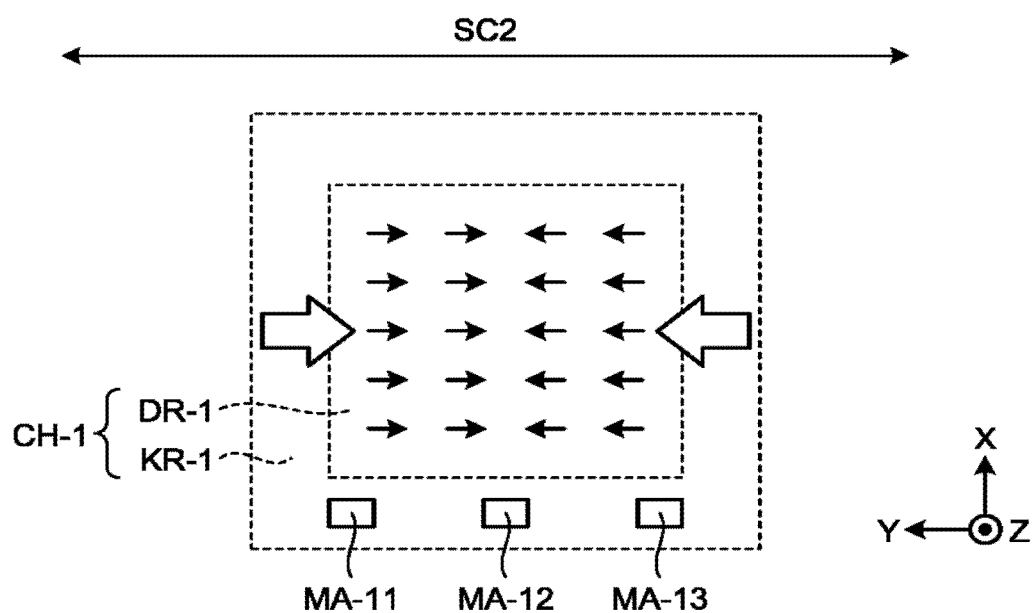
FIGS. 8A and 8B are a diagram and graph illustrating a relation between stresses acting on a chip area and scan speed in scanning exposure in the embodiment.
Figure 8B:
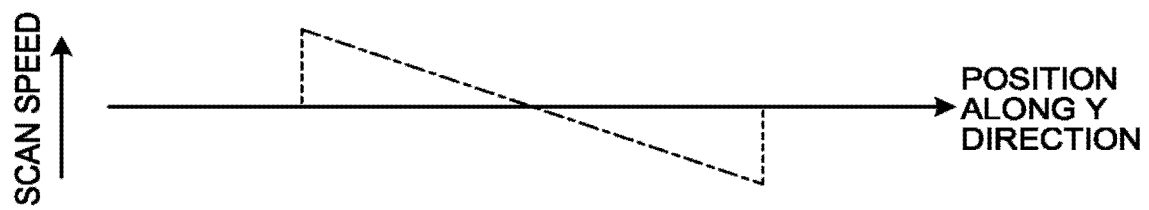

At this time, in the chip area CH-1, if the amounts of positional deviation indicated by solid arrows in FIG. 8A occur in device region DR-1 due to film stresses indicated by open arrows in FIG. 8A, the relative scan speed of the original MK and the substrate WF is changed as indicated by a dot-dashed line in FIG. 8B. FIG. 8A is a diagram illustrating stresses acting on the chip area CH-1; FIG. 8B is a graph illustrating the scan speed in scanning exposure; and FIG. 8 is a diagram and graph illustrating a relation between stresses acting on the chip area and the scan speed in scanning exposure. Thus, because the amount of shift in the Y direction can be changed according to the amount of positional deviation that is different for each Y-coordinate position in device region DR-1, the exposure shape of the chip area CH-1 can be corrected so that the influence of the amounts of positional deviation of the chip area CH-1 is cancelled out.

Figure 7B:
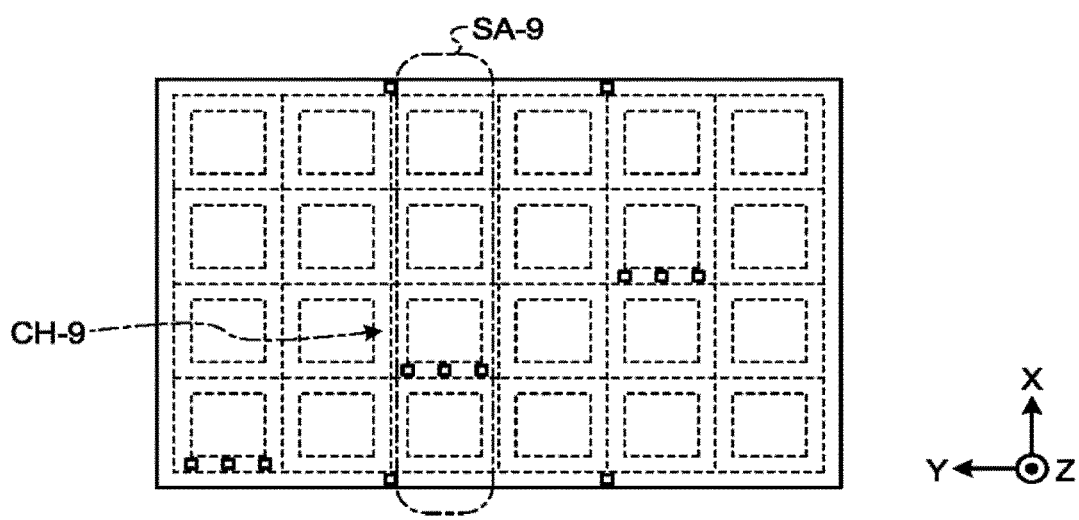

Or the exposure apparatus 1 corrects the exposure shape of the chip area CH-9 according to the amount of positional deviation of the chip area CH-9 during the period when the scan area SA-9 corresponding to the chip area CH-9 is scanned as shown in FIG. 7B. FIG. 7B is a diagram illustrating the scan area SA-9 in scanning exposure by the exposure apparatus 1. That is, the exposure apparatus 1 performs at least one of correcting the projection magnification of the projection optical system 12, correcting the relative scan speed of the original MK and the substrate WF, correcting the inclination of the substrate WF relative to the original MK, and correcting the rotation angle of the substrate WF relative to the original MK according to the amount of positional deviation of the chip area CH-9 during the period when the scan area SA-9 including the chip area CH-9 is scanned. Thus, the exposure shape of the chip area CH-9 can be corrected so that the influence of the amount of positional deviation of the chip area CH-9 is cancelled out.

Figure 7C:
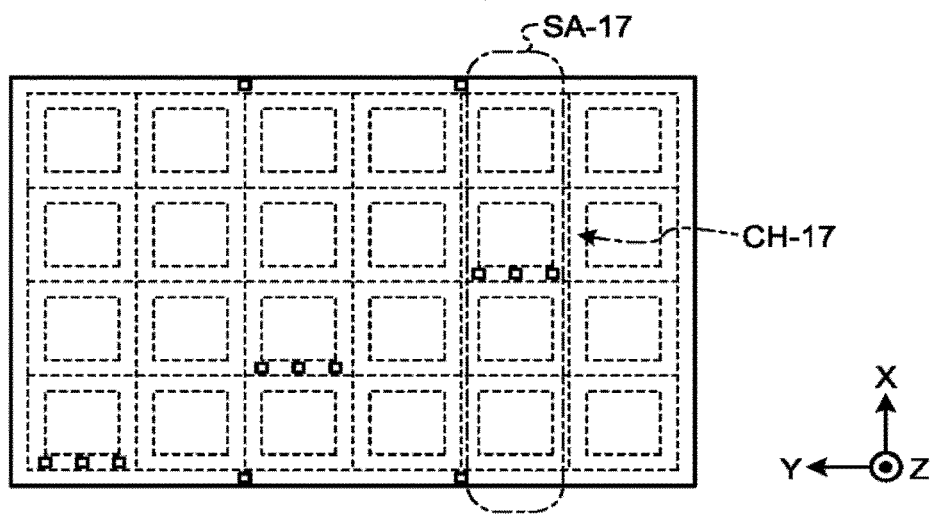

Or the exposure apparatus 1 corrects the exposure shape of the chip area CH-17 according to the amount of positional deviation of the chip area CH-17 during the period when the scan area SA-17 corresponding to the chip area CH-17 is scanned as shown in FIG. 7C. FIG. 7C is a diagram illustrating the scan area SA-17 in scanning exposure by the exposure apparatus 1. That is, the exposure apparatus 1 performs at least one of correcting the projection magnification of the projection optical system 12, correcting the relative scan speed of the original MK and the substrate WF, correcting the inclination of the substrate WF relative to the original MK, and correcting the rotation angle of the substrate WF relative to the original MK according to the amount of positional deviation of the chip area CH-17 during the period when the scan area SA-17 including the chip area CH-17 is scanned. Thus, the exposure shape of the chip area CH-17 can be corrected so that the influence of the amount of positional deviation of the chip area CH-17 is cancelled out.

Referring back to FIG. 6, when the exposure process (S9) finishes, the substrate WF is carried out of the exposure apparatus 1 and carried into a developing apparatus (not shown). The developing apparatus performs development processing to develop latent images formed on the substrate WF by the exposure apparatus 1 (S10).

As such, in the embodiment, the exposure apparatus 1 obtains the amount of positional deviation of a predetermined chip area in a shot area SH including multiple chip areas CH by alignment measurement and controls exposure conditions for the predetermined chip area according to that amount of positional deviation. Thus, because exposure conditions can be controlled for each chip area in the shot area SH, alignment accuracy can be easily improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus which projects a pattern of an original onto a substrate by a projection optical system so as to expose the substrate, the exposure apparatus comprising:
a substrate stage to hold the substrate, the substrate including a plurality of shot areas, each of the shot areas including a plurality of chip areas, the shot areas including a first shot area, the first shot area including a first chip area and a second chip area;
an alignment detecting system that detects multiple first alignment marks placed in a first peripheral region of the first chip area in the first shot area and detects multiple second alignment marks placed in a second peripheral region of the second chip area in the first shot area; and
a controller that obtains a first amount of positional deviation for the first chip area in the first shot area according to results of detecting the multiple first alignment marks, and obtains a second amount of positional deviation for the second chip area in the first shot area according to results of detecting the multiple second alignment marks, controls, in an exposure time for the first shot area, exposure conditions by setting a first exposure condition at a first condition for the first chip area in the first shot area according to the first amount of positional deviation and by changing a second exposure condition at a second condition for the second chip area in the first shot area according to the second amount of positional deviation, the first exposure condition and the second exposure condition include at least (i) a rotation angle of the substrate relative to the original and (ii) a scan speed of the substrate relative to the original in accordance with position along a scan direction when the controller controls an alignment measurement for an intra-substrate-surface correction of the substrate.

2. The exposure apparatus according to claim 1, wherein the controller corrects a first exposure shape of the first chip area in the first shot area according to the first amount of positional deviation and corrects a second exposure shape of the second chip area in the first shot area according to the second amount of positional deviation.

3. The exposure apparatus according to claim 2, wherein the exposure apparatus is a scanning exposure apparatus which projects the pattern of the original onto the substrate by the projection optical system so as to expose the substrate while relatively scanning the original and the substrate, and
wherein the second chip area is shifted in position in the scan direction relative to the first chip area in the first shot area, and
the controller performs at least one of correcting projection magnification of the projection optical system, correcting the relative scan speed of the original and the substrate, correcting an inclination of the substrate relative to the original, and correcting the rotation angle of the substrate relative to the original according to the first amount of positional deviation during a first period in the exposure time for the first shot area and according to the second amount of positional deviation during a second period in the exposure time for the first shot area, the first period being a period when an area corresponding to the first chip area is scanned, the second period being a period when an area corresponding to the second chip area is scanned.

4. The exposure apparatus according to claim 3, wherein the multiple first alignment marks are shifted in position in the scan direction relative to each other in the first chip area in the first shot area, and
wherein the multiple second alignment marks are shifted in position in the scan direction relative to each other in the second chip area in the first shot area.

5. The exposure apparatus according to claim 1, wherein the first shot area further includes a third chip area,
the alignment detecting system further detects multiple third alignment marks placed in a third peripheral region in the third chip area in the first shot area, and
wherein the controller obtains a third amount of positional deviation for the third chip area in the first shot area according to results of detecting the multiple third alignment marks and controls, in the exposure time for the first shot area, the exposure conditions by setting the first exposure condition at the first condition for the first chip area in the first shot area according to the first amount of positional deviation, and by changing the second exposure condition at the second condition for the second chip area in the first shot area according to the second amount of positional deviation, and by changing a third exposure condition at a third condition for the third chip area in the first shot area according to the third amount of positional deviation, the first exposure condition, the second exposure condition, and the third exposure condition include at least the rotation angle of the substrate stage relative to the original when the controller controls the alignment measurement for the intra-substrate-surface correction of the substrate.

6. The exposure apparatus according to claim 5, wherein the controller corrects a first exposure shape of the first chip area in the first shot area according to the first amount of positional deviation and corrects a second exposure shape of the second chip area in the first shot area according to the second amount of positional deviation and corrects a third exposure shape of the third chip area in the first shot area according to the third amount of positional deviation.

7. The exposure apparatus according to claim 6, wherein
the exposure apparatus is a scanning exposure apparatus which projects the pattern of the original onto the substrate by the projection optical system so as to expose the substrate while relatively scanning the original and the substrate,
the second chip area is shifted in position in the scan direction relative to the first chip area in the first shot area,
the third chip area is shifted in position in the scan direction relative to the second chip area in the first shot area, and
wherein the controller performs at least one of correcting projection magnification of the projection optical system, correcting the scan speed of the substrate relative to the original, correcting an inclination of the substrate relative to the original, and correcting the rotation angle of the substrate relative to the original, according to the first amount of positional deviation during a first period in the exposure time for the first shot area, according to the second amount of positional deviation during a second period in the exposure time for the first shot area, and according to the third amount of positional deviation during a third period in the exposure time for the first shot area, the first period being a period when an area corresponding to the first chip area is scanned, the second period being a period when an area corresponding to the second chip area is scanned, the third period being a period when an area corresponding to the third chip area is scanned.

8. The exposure apparatus according to claim 7, wherein
the multiple first alignment marks are shifted in position in the scan direction relative to each other in the first chip area in the first shot area,
wherein the multiple second alignment marks is are shifted in position in the scan direction relative to each other in the second chip area in the first shot area, and
wherein the multiple third alignment marks is shifted in position in the scan direction relative to each other in the third chip area in the first shot area.

9. An exposure method that projects a pattern of an original onto a substrate by a projection optical system so as to expose the substrate, the substrate including a plurality of shot areas, each of the shot areas including a plurality of chip areas, the shot areas including a first shot area, the first shot area including a first chip area and a second chip area, the exposure method comprising:
detecting multiple first alignment marks placed in a first peripheral region of the first chip area in the first shot area;
detecting multiple second alignment marks placed in a second peripheral region of the second chip area in the first shot area;
obtaining a first amount of positional deviation for the first chip area in the first shot area according to results of detecting the multiple first alignment marks;
obtaining a second amount of positional deviation for the second chip area in the first shot area according to results of detecting the multiple second alignment marks;
controlling, in an exposure time for the first shot area, exposure conditions by setting a first exposure condition at a first condition for the first chip area in the first shot area according to the first amount of positional deviation and by changing a second exposure condition at a second condition for the second chip area in the first shot area according to the second amount of positional deviation, the first exposure condition and the second exposure condition include at least (i) a rotation angle of the substrate relative to the original and (ii) a scan speed of the substrate relative to the original in accordance with position along a scan direction when a controller controls an alignment measurement for an intra-substrate-surface correction of the substrate.

10. The exposure method according to claim 9, wherein
the first shot area includes a third chip area,
the exposure method further comprising:
detecting multiple third alignment marks placed in a third peripheral region of the third chip area in the first shot area; and
obtaining a third amount of positional deviation for the third chip area in the first shot area according to results of detecting the multiple third alignment marks, wherein
the controlling includes controlling, in the exposure time for the first shot area, the exposure conditions by setting the first exposure condition at the first condition for the first chip area in the first shot area according to the first amount of positional deviation and by changing the second exposure condition at the second condition for the second chip area in the first shot area according to the second amount of positional deviation and by changing a third exposure condition at a third condition for the third chip area in the first shot area according to the third amount of positional deviation, the first exposure condition, the second exposure condition, and the third exposure condition include at least the rotation angle of the substrate relative to the original when the controller controls the alignment measurement for the intra-substrate-surface correction of the substrate.

11. The exposure method according to claim 10, wherein
the exposure method is a scanning exposure method that projects the pattern of the original onto the substrate by the projection optical system so as to expose the substrate while relatively scanning the original and the substrate,
wherein the second chip area is shifted in position in the scan direction relative to the first chip area in the first shot area,
the third chip area is shifted in position in the scan direction relative to the second chip area in the first shot area,
the controlling includes performing at least one of correcting projection magnification of the projection optical system, correcting the scan speed of the substrate relative to the original, correcting an inclination of the substrate relative to the original, and correcting the rotation angle of the substrate relative to the original according to the first amount of positional deviation, during a first period in the exposure time for the first shot area, according to the second amount of positional deviation during a second period in the exposure time for the first shot area, and according to the third amount of positional deviation during a third period in the exposure time for the first shot area, the first period being a period when an area corresponding to the first chip area is scanned, the second period being a period when an area corresponding to the second chip area is scanned, the third period being a period when an area corresponding to the third chip area is scanned.

12. The exposure method according to claim 9, wherein
the exposure method is a scanning exposure method that projects the pattern of the original onto the substrate by the projection optical system so as to expose the substrate while relatively scanning the original and the substrate, and wherein the second chip area is shifted in position in the scan direction relative to the first chip area in the first shot area, the controlling includes performing at least one of correcting projection magnification of the projection optical system, correcting the scan speed of the substrate relative to the original, correcting an inclination of the substrate relative to the original, and correcting the rotation angle of the substrate relative to the original according to the first amount of positional deviation during a first period in the exposure time for the first shot area and according to the second amount of positional deviation during a second period in the exposure time for the first shot area, the first period being a period when an area corresponding to the first chip area is scanned, the second period being a period when an area corresponding to the second chip area is scanned.

13. A semiconductor device manufacturing method, comprising:

exposing the substrate by the exposure method according to claim 9 to form a latent image according to the pattern of the original on the substrate; and developing the formed latent image.

\* \* \* \* \*